(12) United States Patent
Kim

(10) Patent No.: US 12,424,569 B2
(45) Date of Patent: Sep. 23, 2025

(54) SEMICONDUCTOR STRUCTURE AND METHOD FOR MANUFACTURING PREPARING SAME

(71) Applicant: CHANGXIN MEMORY TECHNOLOGIES, INC., Hefei (CN)

(72) Inventor: Sungjin Kim, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 423 days.

(21) Appl. No.: 18/156,345

(22) Filed: Jan. 18, 2023

(65) Prior Publication Data

US 2023/0154869 A1 May 18, 2023

Related U.S. Application Data

(63) Continuation of application No. PCT/CN2022/075705, filed on Feb. 9, 2022.

(30) Foreign Application Priority Data

Oct. 12, 2021 (CN) .......................... 202111186670.3

(51) Int. Cl.
*H01L 23/00* (2006.01)
*H01L 21/78* (2006.01)
*H01L 23/544* (2006.01)

(52) U.S. Cl.
CPC ............ *H01L 23/562* (2013.01); *H01L 21/78* (2013.01); *H01L 23/544* (2013.01); *H01L 2223/5446* (2013.01)

(58) Field of Classification Search
CPC ..... H01L 23/562; H01L 21/78; H01L 23/544; H01L 2223/5446; H01L 2223/54426; H01L 23/585; B23K 26/38; B28D 5/0058; B28D 5/02
See application file for complete search history.

(56) References Cited

U.S. PATENT DOCUMENTS

| 8,648,444 | B2 | 2/2014 | Chen | |
|---|---|---|---|---|
| 2006/0125059 | A1* | 6/2006 | Chen | H01L 23/544 |
| | | | | 257/E23.179 |
| 2006/0145347 | A1* | 7/2006 | Aida | H01L 23/585 |
| | | | | 257/E21.582 |
| 2007/0018326 | A1* | 1/2007 | Hasegawa | H01L 23/585 |
| | | | | 257/758 |

(Continued)

FOREIGN PATENT DOCUMENTS

| CN | 101047176 A | 10/2007 |
|---|---|---|
| CN | 101447463 A | 6/2009 |

(Continued)

*Primary Examiner* — Victor A Mandala
(74) *Attorney, Agent, or Firm* — SYNCODA LLC; Feng Ma

(57) ABSTRACT

A semiconductor structure includes a base layer, a device layer, and a stress propagating layer. The device layer is located on the base layer. The device layer includes a first dielectric layer and device structures. The first dielectric layer fills the device layer and isolates the device structures. The stress propagating layer is located on the device layer, includes a second dielectric layer and a plurality of stress propagating patterns arranged at intervals. The second dielectric layer fills the stress propagating layer and isolates the stress propagating patterns.

10 Claims, 8 Drawing Sheets

(56) References Cited

U.S. PATENT DOCUMENTS

| | | | |
|---|---|---|---|
| 2008/0017965 A1* | 1/2008 | Nomura | H01L 23/585 257/E21.598 |
| 2009/0140393 A1 | 6/2009 | Chen | |
| 2009/0289325 A1* | 11/2009 | Wang | H01L 23/562 257/E29.02 |
| 2010/0001405 A1* | 1/2010 | Williamson | H01L 23/585 257/774 |
| 2010/0072578 A1* | 3/2010 | Kunishima | H01L 23/585 257/E23.179 |
| 2019/0164910 A1* | 5/2019 | Roh | H10B 12/50 |
| 2020/0058543 A1* | 2/2020 | Han | H01L 23/544 |
| 2021/0066150 A1* | 3/2021 | Nakata | H01L 23/16 |
| 2021/0098351 A1* | 4/2021 | Chou | H01L 23/49894 |
| 2021/0098392 A1* | 4/2021 | Wu | H10F 39/024 |
| 2021/0210440 A1* | 7/2021 | Manack | H01L 23/528 |
| 2021/0375785 A1* | 12/2021 | Wu | H01L 21/4857 |
| 2023/0017688 A1* | 1/2023 | Lai | H01L 21/6835 |

FOREIGN PATENT DOCUMENTS

| | | |
|---|---|---|
| CN | 104752325 A | 7/2015 |
| CN | 105845559 A | 8/2016 |
| CN | 209216946 U | 8/2019 |
| CN | 113937065 A | 1/2022 |
| JP | 2012089668 A | 5/2012 |
| TW | 246732 B | 1/2006 |

* cited by examiner

SEMICONDUCTOR STRUCTURE AND METHOD FOR MANUFACTURING PREPARING SAME

CROSS-REFERENCE TO RELATED APPLICATIONS

This is a continuation application of International Application No. PCT/CN2022/075705 filed on Feb. 9, 2022, which claims priority to Chinese Patent Application No. 202111186670.3 filed on Oct. 12, 2021. The disclosures of the above-referenced applications are hereby incorporated by reference in their entirety.

BACKGROUND

In a semiconductor manufacturing process, it is required to saw a wafer into chips, and then make these chips into different semiconductor packaging structures. In some implementations, wafer sawing is not only a key process of a semiconductor packaging process, but also a bottleneck process in the capacity of the whole semiconductor packaging process.

With the development of semiconductor technology, an integration of chips becomes higher and higher, while a dimension of the corresponding chips becomes smaller and smaller, a sawing width becomes smaller and smaller, and a sawing lane becomes narrower and narrower. Therefore, compared with a wide sawing lane, it becomes more difficult to separate the chips.

It is to be noted that the information disclosed in the above background section is only for enhancement of understanding of the background of the disclosure, and therefore may include information that does not constitute a related art known to a person of ordinary skill in the art.

SUMMARY

The disclosure relates to the technical field of semiconductors, in particular to a semiconductor structure and a method for manufacturing the same.

A purpose of the disclosure is to overcome deficiencies of the above-mentioned implementations and to provide a semiconductor structure and a method for manufacturing the semiconductor structure.

According to one aspect of the present disclosure, a semiconductor structure is provided. The semiconductor structure includes: a base layer; a device layer that is located on the base layer and includes a first dielectric layer and device structures, in which the first dielectric layer fills the device layer and isolates the device structures; a stress propagating layer that is located on the device layer and includes a second dielectric layer and a plurality of stress propagating patterns arranged at intervals, in which the second dielectric layer fills the stress propagating layer and isolates the stress propagating patterns.

According to another aspect of the present disclosure, a method for manufacturing a semiconductor structure is provided, which includes the following operations.

A base layer is provided.

A device layer is formed on the base layer. The device layer includes a first dielectric layer and device structures. The first dielectric layer fills the device layer and isolates the device structures.

A stress propagating layer is formed on the device layer. The stress propagating layer includes a second dielectric layer and a plurality of stress propagating patterns arranged at intervals. The second dielectric layer fills the stress propagating layer and isolates the stress propagating patterns.

BRIEF DESCRIPTION OF THE DRAWINGS

Drawings herein are incorporated into and constitute a part of the specification, show embodiments consistent with the disclosure and serve to explain the principles of the disclosure together with the specification. It is apparent that the drawings described below are only some embodiments of the disclosure, from which other drawings can be obtained without creative effort for a person of ordinary skill in the art.

DETAILED DESCRIPTION

Figure 1:
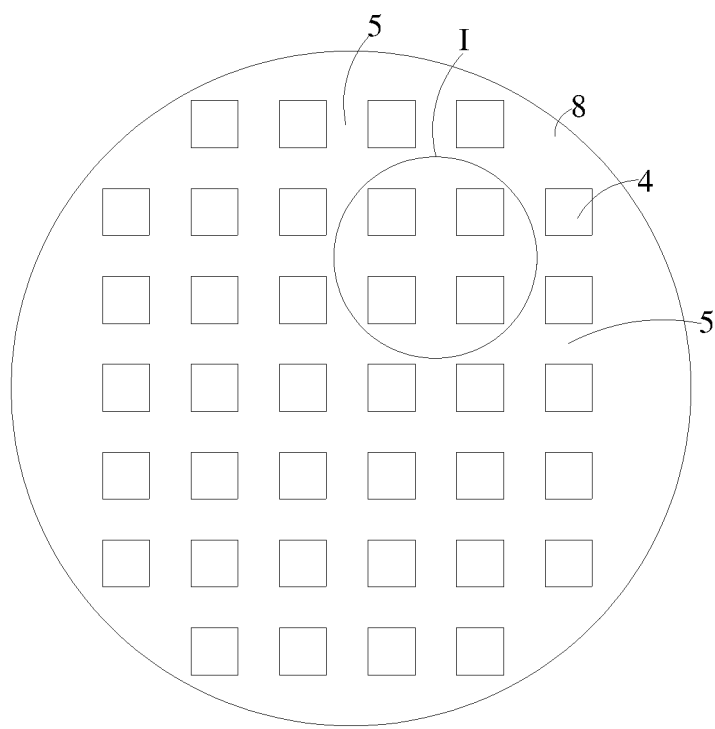
FIG. 1 schematically shows a structure of a semiconductor structure.

The exemplary embodiments will be described more fully with reference to the accompanying drawings. However, the exemplary embodiments can be implemented in various forms and should not be construed as limited to the embodiments set forth herein. Rather, these embodiments are provided to perfect and complete this disclosure, and to fully convey the concept of the exemplary embodiments to those skilled in the art. The same reference numerals in the drawings denote the same or similar structures, and thus their detailed description will be omitted. In addition, it is apparent that the accompanying drawings are merely exemplary illustrations of the disclosure, and may be not drawn to scale.

Although relative terms such as "above" and "below" are used in the specification to describe a relative relationship of one component to another component as illustrated in the drawings, these terms are used in the specification only for convenience of descriptive purposes, for example according to the direction of the example described in the accompanying drawings. It is to be understanding that, if the apparatus in the drawings is turned over, the component described as "above" other components would then be oriented "below" the other components. When a structure is described as "on" other structures, it may mean that this structure is integrally formed with the other structures, or that this structure is "directly" arranged on the other structures, or that this structure is "indirectly" arranged on the other structures through another structure.

The terms "a/an", "one", "the/said", and "at least one" are used to indicate that there are one or more elements/components/etc. The terms "include/comprise" and "has/have/having" are used to indicate an open-ended inclusion, means that additional elements/components/etc. may be present in addition to the listed elements/components/etc. The terms "first", "second" and "third" etc. are used only for indicating, and are not intend to limit the number of objects to which they refer.

Figure 2:
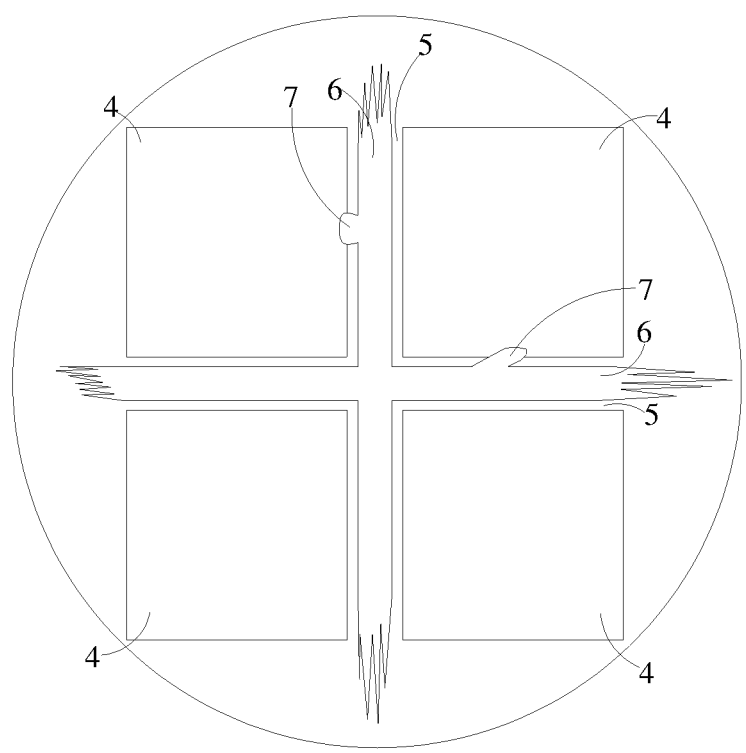
FIG. 2 schematically shows a partial enlarged diagram of a defect generated by sawing a part indicated by I in FIG. 1.

Referring to FIG. 1, a semiconductor structure 8, such as a wafer, has a plurality of chip areas 4. A sawing lane 5 is provided between two adjacent chip areas 4. The wafer is sawed along the sawing lane 5 to separate the adjacent chips. With the improvement of integration of semiconductor devices, a width of the sawing lane 5 becomes narrower and narrower, resulting in an increasing stress on part of a dielectric layer close to the sawing lane 5. A crack 7 generated during sawing the wafer may extend into adjacent chip areas 4 to produce an error shown in FIG. 2, which destroys a interconnect structure of the chip areas 4, cracks a plug layer in the interconnect structure, and disconnects a signal transmission channel, and leads to the failure of the chip, finally resulting in that some functions of the chip cannot work normally or performances of the chip cannot meet design requirements, and thus the sawing yield decreases.

Figure 3:
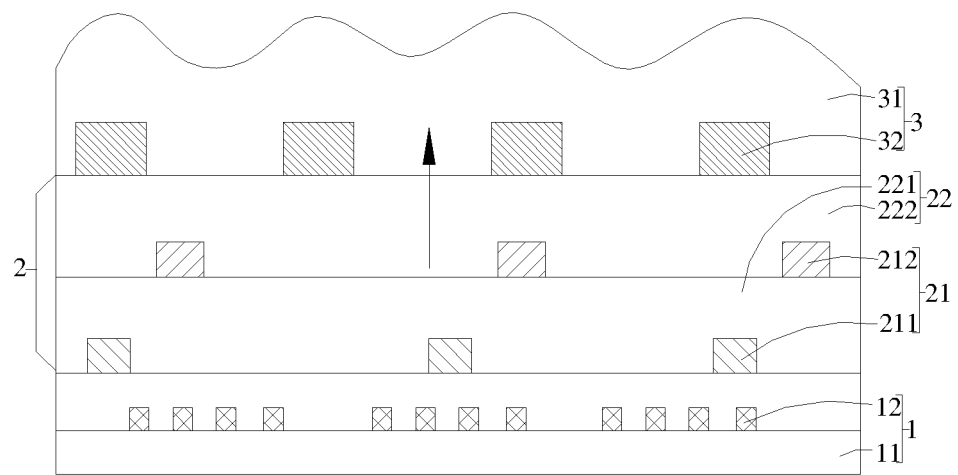
FIG. 3 schematically shows a structure of a semiconductor structure of an exemplary embodiment of the disclosure.

As shown in FIG. 3, a semiconductor structure is provided in an embodiment of the disclosure. The semiconductor structure includes a base layer 1, a device layer 2, and a stress propagating layer 3. The base layer 1 includes a substrate 11 and a memory device 12. In some embodiments, the substrate 11 may be germanium, silicon germanium, gallium arsenide or silicon on insulator. Those skilled in the art can select the material of the substrate 11 as required, which is not limited herein. The memory device 12 includes a transistor, a resistor, a capacitor, an inductor, etc. The memory device 12 mentioned may be used to constitute a volatile memory (DRAM, SDRAM, etc.), a nonvolatile memory (Nand, NOR, Flash, etc.). A person skilled in the art can determine the corresponding type of the memory device 12 to be formed as required, which is not limited herein.

The device layer 2 is located on the base layer 1. The device layer 2 includes a first dielectric layer 22 and device structures 21. The first dielectric layer 22 fills the device layer 2 and isolates the device structures 21. In some embodiments, the device structures 21 include testing structures, which may be, in particular, alignment marks for alignment, test pads for testing the performance of the chip, and the like.

The stress propagating layer 3 is located on the device layer 2. The stress propagating layer 3 includes a second dielectric layer 31 and a plurality of stress propagating patterns 32 arranged at intervals. The second dielectric layer 31 fills the stress propagating layer 3 and isolates the stress propagating patterns 32.

Specifically, the plurality of stress propagating patterns 32 are disposed on a side, facing away from the base layer 1, of the first dielectric layer 22. The adjacent stress propagating patterns 32 are disposed at intervals. The second dielectric layer 31 fills the stress propagating layer 3, isolates the stress propagating patterns 32, and covers the first dielectric layer 22.

Since the plurality of stress propagating patterns 32 are arranged in the second dielectric layer 31 at intervals, stress dispersion can be effectively avoided, thereby ensuring that sawing stress is intensively transferred from the first dielectric layer 22 to the second dielectric layer 31, and further ensuring complete separation of the chips after sawing. Meanwhile, since the stress propagating patterns 32 are arranged at intervals, a lateral diffusion of the stress is avoided during sawing the chips, and a sawing area 6 can be prevented from extending to the chip areas 4, thereby improving the sawing yield of the chips and ensuring the structural integrity of the chips.

In some embodiments, a hardness of the second dielectric layer 31 is higher than that of the first dielectric layer 22. That is, the second dielectric layer 31 has higher brittleness. When the sawing stress is propagated to the second dielectric layer 31, the second dielectric layer 31 can be completely sawed even if the stress decreases at this time, thereby improving the sawing yield.

In some embodiments, the material of the first dielectric layer 22 may be a low-K dielectric material, which is beneficial to reduce a coupling capacitance between device structures 21. The low-K dielectric material may include doped silicon oxide, organic polymer or porous material, etc., Specifically, The low-K dielectric material may be fluorinated silicate glass (FSG), carbon doped glass, organo silicate glass (OSG), hydrogen doped glass, porous carbon doped glass, porous silicon dioxide. The second dielectric layer 31 is a general dielectric material or a high-K dielectric material, such as silicon oxide, silicon nitride and silicon oxynitride, that having a hardness higher than that of the low-K dielectric material, which can ensure that the second dielectric layer 31 is completely sawed when the stress is spread to the second dielectric layer 31, and finally the chips are completely separated.

Figure 4:
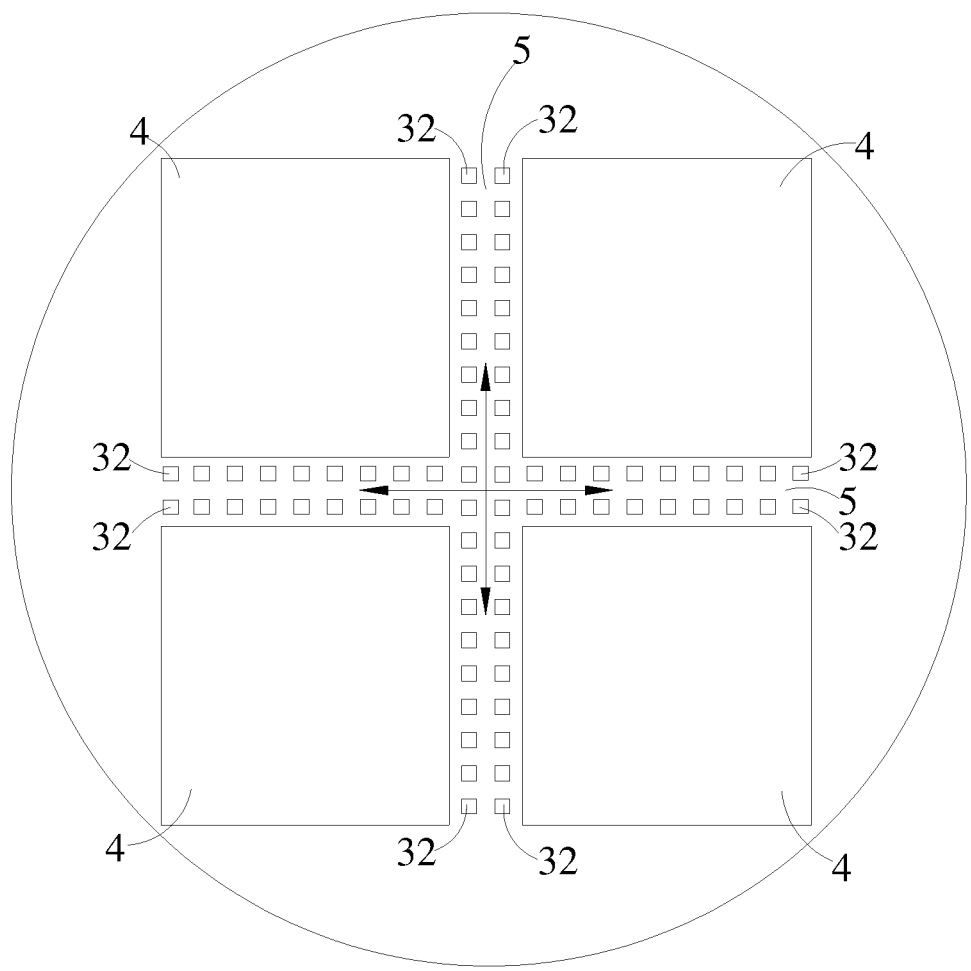
FIG. 4 schematically shows a top view of the semiconductor structure shown in FIG. 3.

In some embodiments, referring to FIG. 4, a sawing direction is indicated by arrows shown therein. The semiconductor structure has the plurality of chip areas 4. A sawing lane 5 is provided between two adjacent chip areas 4. The device layer 2 and the stress propagating layer 3 are arranged at least in the sawing lane 5, and the semiconductor structure is sawed along the sawing lines 5.

In some embodiments, referring to FIG. 4, at least two columns of the stress propagation patterns 32 are provided in the sawing lane 5 along the sawing direction. The plurality of stress propagating patterns 32 in the two columns are arranged at intervals. That is, in one sawing lane 5, two stress propagating patterns 32 are arranged horizontally at intervals along a direction perpendicular to the sawing direction, and thus the stress propagating patterns 32 is arranged in the sawing lane 5 in an array of 2×N (N is the number of the stress propagating patterns 32 along the sawing direction, and is a positive integer greater than or equal to 2).

Figure 5:
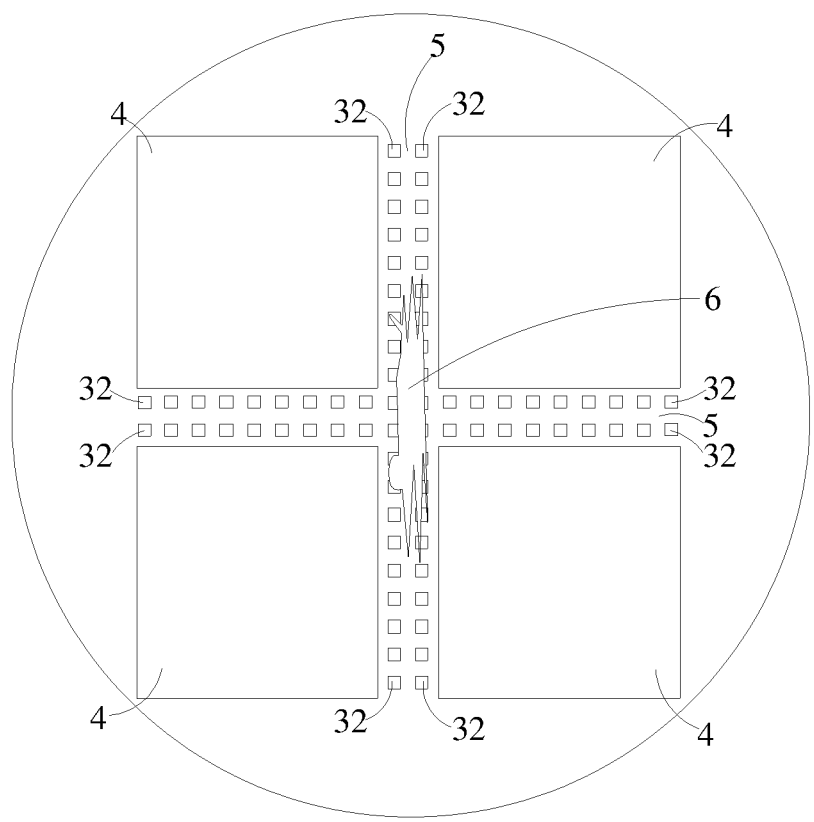
FIG. 5 schematically shows a structure of a semiconductor structure shown in FIG. 4 during sawing.

In some embodiments, the semiconductor structure 8 may be sawed along the sawing lane 5 by a laser or a rotating blade to separate adjacent chip areas 4. Referring to FIG. 5, during sawing the semiconductor structure 8, a sawing is performed by laser or the rotating blade saws along a area between the two columns of stress propagation patterns 32. Since the stress propagating patterns 32 are arranged at intervals, a lateral diffusion of the stress is avoided during sawing the semiconductor structure 8, which then can prevent a sawing area 6 from extending to the chip area 4, thereby improving the sawing yield of the chips and ensuring the structural integrity of the chips.

In some embodiments, the stress propagating patterns 32 may also be staggered. For example, the stress propagation patterns 32 in one column are arranged in corresponding to gaps between every two adjacent one of the stress propagation patterns 32 in another column, so as to further improve a blocking degree to the stress.

Figure 6:
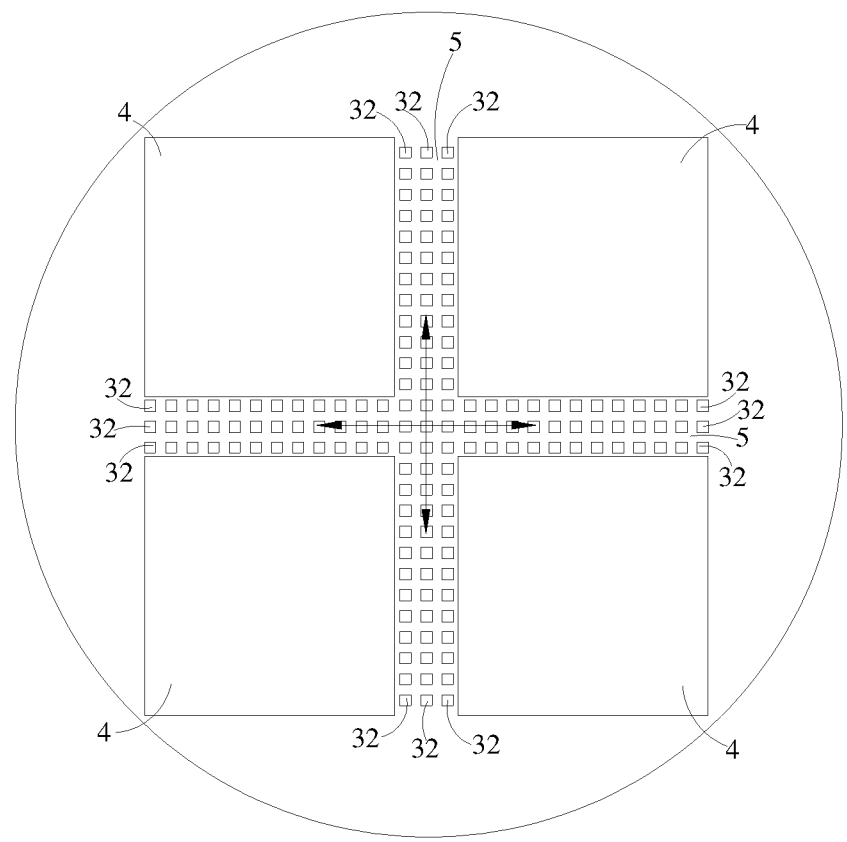
FIG. 6 schematically shows a top view of a semiconductor structure of another exemplary embodiment of the disclosure.

In some embodiments, referring to FIG. 6, the stress propagation patterns 32 in one sawing lane 5 may also be provided in three, four, or more columns along the sawing direction. Specifically, within one sawing lane 5, the plurality of stress propagating patterns 32 may be arranged in an array of 3×N, 4×N, or M×N, where N is the number of stress propagating patterns 32 along the sawing direction, and is a positive integer greater than or equal to 2. In the above array arrangement, three, four, or more columns of the stress propagating patterns 32 may be staggered from each other or partially staggered in one sawing lane 5. All of the above arrangements fall within the scope of the disclosure protection.

In some embodiments, for different sawing lanes 5 of the same semiconductor structure 8, the numbers of columns of the stress propagating patterns 32 may be different. Specifically, the stress propagating patterns may have different sizes, and thus when the size of the stress propagating patterns 32 is smaller, the number of the corresponding columns can be increased. In addition, the width of the sawing lane 5 is varied depending on the setting of the chip areas 4. Therefore, the number of columns of the stress propagating patterns 32 that can be arranged may also be different.

In some embodiments, the stress propagating patterns 32 may be provided not only in the sawing lane 5, but also in the chip areas 4. Specifically, corresponding areas may be pre-set in the chip area 4. For example, when the sawing lane 5 is set very narrow, blank areas may be arranged in the edge areas of the chip areas 4. By forming the stress propagating patterns 32 in the blank areas, the stress generated during sawing can also be avoided from extending to the chip areas 4, so as to protect the chip areas 4.

In some embodiments, referring to FIG. 3, the device structures 21 may also include first device structures 211 and second device structures 212. The first dielectric layer 22 includes a first sub-dielectric layer 221 and a second sub-dielectric layer 222.

Specifically, the plurality of first device structures 211 are formed at intervals on the base layer 1. The first sub-dielectric layer 221 fills the first device structures 211 and covers the base layer 1. The plurality of second device structures 212 are formed at intervals on the first sub-dielectric layer 221. The second sub-dielectric layer 222 fills the second device structures 212 and covers the first sub-dielectric layer 221.

In some embodiments, third device structures and corresponding filling dielectric layer may also be arranged as required, which is not limited here.

Figure 7:
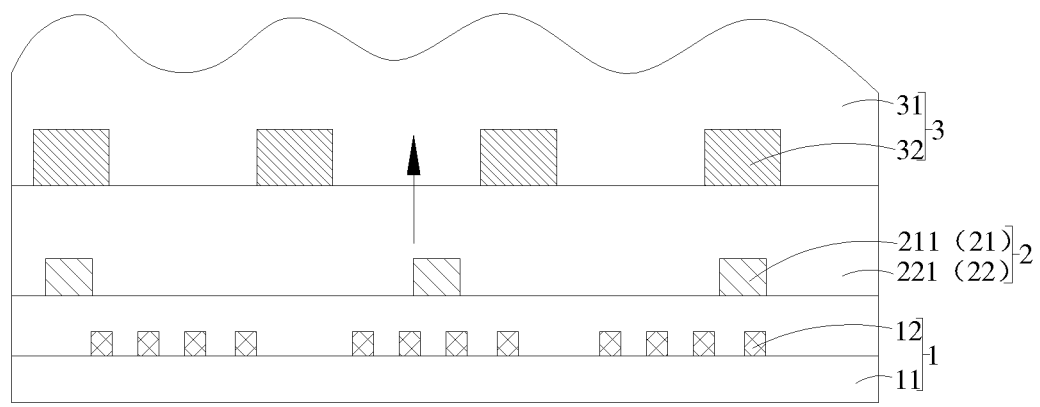
FIG. 7 schematically shows a structure of a semiconductor structure of yet exemplary embodiment of the disclosure.

In some embodiments, referring to FIG. 7, the device layer 2 may include only the first sub-dielectric layer 221 and the first device structures 211, which is not limited here in total number thereof.

In some embodiments, with reference to FIG. 4 to FIG. 6, the cross-section of the stress propagating patterns 32 in a direction parallel to the base layer 1 may be in one or more shapes of rectangle, circle, an ellipse, or a trapezoid. In addition, the stress propagating layer 3 of the semiconductor structure 8 may include a plurality of first stress propagating patterns and a plurality of second stress propagating patterns. In the direction parallel to the base layer 1, the cross-section of the first stress propagating patterns is in the shape of circle, and the cross-section of the second stress propagating patterns is in the shape of ellipse. That is to say, the first stress propagating patterns may be different from the second stress propagating patterns. Of course, the stress propagating layer may further include third stress propagating patterns, and the cross-section of the third stress propagating patterns may be in the shape of trapezoid in the direction parallel to the base layer 1. The cross-section of the stress propagating patterns 32 may be in other shapes and will not be repeated here.

In some embodiments, the stress propagating patterns 32 may be made of metallic aluminum. In addition, copper, tungsten and the like may also be used. The above materials may be compatible with the prior art. That is, the stress propagating patterns 32 can be formed simultaneously with the formation of a metal distribution layer.

Figure 8:
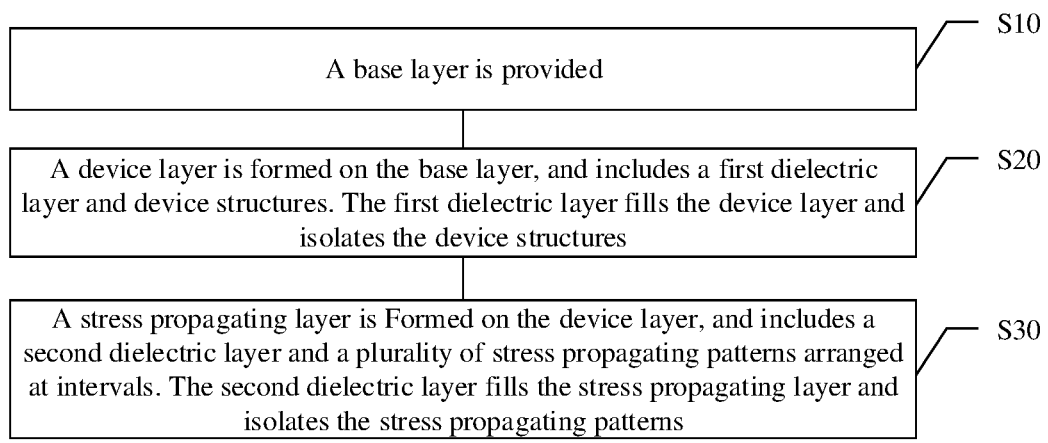
FIG. 8 schematically shows a flowchart of an exemplary embodiment of a method for manufacturing a semiconductor structure of the disclosure.

Based on the same inventive concept, the exemplary embodiments of the disclosure also provide a method for manufacturing a semiconductor structure. Referring to FIG. 8 schematically showing the flowchart of an exemplary embodiment of a method for manufacturing a semiconductor structure of the disclosure, the method for manufacturing a semiconductor structure includes the following steps.

In step S10, a base layer 1 is provided.

In step S20, a device layer 2 is formed on the base layer 1. The device layer 2 includes a first dielectric layer 22 and device structures 21. The first dielectric layer 22 fills the device layer 2 and isolates the device structures 21.

In step S30, a stress propagating layer 3 is formed on the device layer 2. The stress propagating layer 3 includes a second dielectric layer 31 and a plurality of stress propagating patterns 32 arranged at intervals. The second dielectric layer 31 fills the stress propagating layer 3 and isolates the stress propagating patterns 32.

Each step of the method for manufacturing the semiconductor structure will be described in detail below.

In step S10, a base layer 1 is provided.

In some embodiments, the base layer 1 includes a substrate 11 and memory devices 12. Those skilled in the art may select the memory devices 12 and the material of the substrate 11 as required, which have been mentioned in detail in the foregoing description for semiconductor structure, and are not limited herein.

In step S20, the device layer 2 is formed on the base layer 1. The device layer 2 includes the first dielectric layer 22 and the device structure 21. The first dielectric layer 22 fills the device layer 2 and isolates the device structures 21.

In some embodiments, a first conductive material layer is formed on the base layer 1 by a process such as deposition or electroplating. A patterning process is performed on the first conductive material layer to form the first device structures 211 arranged at intervals. The first device structures 211 arranged at intervals expose the base layer 1.

A first sub-dielectric layer 221 is deposited on the first device structures 211 and the base layer 1. The first sub-dielectric layer 221 covers the first device structures 211 and the base layer 1. The first sub-dielectric layer 221 is polished to flatten an upper surface of the first sub-dielectric layer 221.

A second conductive material layer is formed on the first sub-dielectric layer 221 by a process such as deposition or electroplating. A patterning process is performed on the second conductive material layer to form second device structures 212 arranged at intervals. The second device structures 212 arranged at intervals expose the first sub-dielectric layer 221.

A second sub-dielectric layer 222 is formed on the second device structures 212 and the first sub-dielectric layer 221 by deposition. The second sub-dielectric layer 222 covers the first sub-dielectric layer 221 and the second device structures 212. The second sub-dielectric layer 222 is polished to flatten an upper surface of the second sub-dielectric layer 222.

The first sub-dielectric layer 221 and the second sub-dielectric layer 222 together form the first dielectric layer 22. The first device structures 211 and the second device structures 212 together constitute the device structures 21.

Referring to FIG. 7, the device layer 2 may include only the first sub-dielectric layer 221 and the first device structures 211, which is not limited here in total number thereof.

In step S30, the stress propagating layer 3 is formed on the device layer 2. The stress propagating layer 3 includes a second dielectric layer 31 and the plurality of stress propagating patterns 32 arranged at intervals. The second dielectric layer 31 fills the stress propagating layer 3 and isolates the stress propagating patterns 32.

In some embodiments, a stress propagating material layer is formed on the first dielectric layer 22 by deposition or electroplating. A patterning process is performed the stress propagating material layer to form the plurality of stress propagating patterns 32 arranged at intervals. The stress propagating patterns 32 arranged at intervals expose the first dielectric layer 22.

A second dielectric layer 31 is formed on the plurality of stress propagating patterns 32 arranged at intervals and the first dielectric layer 22 by deposition. The second dielectric layer 31 covers the plurality of stress propagating patterns 32 arranged at intervals and the first dielectric layer 22.

It is to be noted that, the deposition process involved in the above process may specifically include plasma vapor deposition (PVD), chemical vapor deposition (CVD), and electroplating (Plating). The polishing process may include a chemical mechanical polishing process. The patterning process may be realized by photolithography, wet etching, dry etching, etc. A mask layer used in the patterning process may include spin coating hard mask, photoresist, etc. The above processes can be obtained in the existing technology, which will not be repeated here.

In some embodiments, the hardness of the first dielectric layer 22 is less than that of the second dielectric layer 31. Specific materials of the first dielectric layer 22 and the second dielectric layer 31 have been described in detail above and are therefore not repeated here.

In some embodiments, the semiconductor structure 8 has the plurality of chip areas 4. A sawing lane 5 is provided between two adjacent ones of the chip areas 4. The device layer 2 and the stress propagating layer 3 are formed at least within the sawing lane 5. The specific arrangement of the stress propagating patterns 32 has been described in detail above and will not be repeated here.

In some embodiments, the semiconductor structure 8 may be sawed along the sawing lane 5 to form a plurality of chips. Specially, the semiconductor structure 8 may be sawed along the sawing lane 5 by laser or a rotating blade to separate the chip areas 4. Sawing by the rotating blade may include mechanical sawing, scribing and breaking. The chips after sawing are picked from a sawing tape by a chip picking device (such as a chip bonder or a chip sorter) to form individual chips.

In some embodiments, two columns of the stress propagation patterns 32 are arranged along the sawing direction in one sawing lane 5. The sawing may be performed by laser or the rotating blade saws along an area between the two columns of stress propagating patterns 32.

In addition, in a case that three columns of stress propagation patterns 32 are arranged in one sawing line 5 along the sawing direction, the sawing may be performed by laser or the rotary blade along the middle column of the stress propagating patterns 32, or may be performed along any one of two gaps among the three columns of the stress propagating patterns 32.

After the sawing process, the individual chips are packaged into packages for manufacturing electronic devices such as computers. The chip is integrated into a lead-frame package, which is directly disposed on the substrate of the base plate of personal computer, or packaged by solder bumping technology.

It is to be noted that, although each step of the method for manufacturing a semiconductor structure of the disclosure is described in a specific order in the drawings, it does not require or imply that these steps should be performed in the specific order, or that all of the shown steps must be performed in order to achieve the desired results. Additionally or alternatively, some steps may be omitted, a plurality of steps may be merged and performed in form of one step, and/or one step may be split and performed in form of the plurality of steps.

Those skilled in the art may readily think of other embodiments of the disclosure after considering the specification and practicing the disclosure disclosed herein. The application is intended to cover any variant, uses or adaptations of the disclosure that follow general principles of the disclosure and include common knowledge or common techniques in the art not disclosed in the disclosure. The specification and embodiments are only regarded as illustratively, and a true scope and spirit of the disclosure are indicated by the appended claims.

What is claimed is:

1. A semiconductor structure comprising: a base layer; a device layer located on the base layer, wherein the device layer comprises a first dielectric layer and device structures, and the first dielectric layer fills the device layer and isolates the device structures; a stress propagating layer located on the device layer, wherein the stress propagating layer comprises a second dielectric layer and a plurality of stress propagating patterns arranged at intervals, and the second dielectric layer fills the stress propagating layer and isolates the stress propagating patterns; a plurality of chip areas, and a sawing lane disposed between two adjacent chip areas, wherein the device layer and the stress propagating layer are arranged at least in the sawing lane, the stress propagating patterns completely surround each of the chip areas; wherein the stress propagating patterns are arranged in at least two columns along a sawing direction in one sawing lane; and wherein a hardness of the first dielectric layer is less than a hardness of the second dielectric layer.

2. The semiconductor structure of claim 1, wherein the plurality of the stress propagation patterns are arranged in the sawing lane in an array.

3. The semiconductor structure of claim 1, wherein a cross-section of the stress propagating patterns is in one or more shapes of rectangle, circle, and ellipse in a direction parallel to the base layer.

4. The semiconductor structure of claim 1, wherein a material of the stress propagation patterns is metallic aluminum.

5. The semiconductor structure of claim 1, wherein a material of the first dielectric layer is a low-k dielectric material.

6. The semiconductor structure of claim 1, wherein the device structures comprise testing structures.

7. A method for manufacturing a semiconductor structure, comprising: providing a base layer; forming a device layer on the base layer, wherein the device layer comprises a first dielectric layer and device structures, and the first dielectric layer fills the device layer and isolates the device structures; forming a stress propagating layer on the device layer, wherein the stress propagating layer comprises a second dielectric layer and a plurality of stress propagating patterns arranged at intervals, and the second dielectric layer fills the stress propagating layer and isolates the stress propagating patterns; and forming a plurality of chip areas, and a sawing lane disposed between two adjacent chip areas, wherein the device layer and the stress propagating layer are arranged at least in the sawing lane, the stress propagating patterns completely surround each of the chip areas; wherein the stress propagating patterns are arranged in at least two columns along a sawing direction in one sawing lane; and wherein a hardness of the first dielectric layer is less than a hardness of the second dielectric layer.

8. The method for manufacturing a semiconductor structure of claim 7, further comprising:
sawing the semiconductor structure along the sawing lane.

9. The method for manufacturing a semiconductor structure of claim 7, comprising:
sawing the semiconductor structure along the sawing lane by a laser or a rotating blade to separate the chip areas.

10. The method for manufacturing a semiconductor structure of claim 9, wherein the sawing the semiconductor structure along the sawing lane comprises sawing an area between the two columns of the stress propagation patterns.

\* \* \* \* \*